United States Patent
Nagao et al.

(10) Patent No.: US 7,564,720 B2
(45) Date of Patent: Jul. 21, 2009

(54) NONVOLATILE STORAGE AND ERASE CONTROL

(75) Inventors: Mitsuhiro Nagao, Tajimi (JP);
Masahiro Niimi, Okazaki (JP); Kenji Nagai, Mizunami (JP)

(73) Assignee: Spansion LLC, Sunnyvale, CA (US)

( * ) Notice: Subject to any disclaimer, the term of this patent is extended or adjusted under 35 U.S.C. 154(b) by 187 days.

(21) Appl. No.: 11/879,989

(22) Filed: Jul. 18, 2007

(65) Prior Publication Data

US 2008/0049503 A1    Feb. 28, 2008

Related U.S. Application Data

(63) Continuation-in-part of application No. PCT/JP2006/314151, filed on Jul. 18, 2006.

(51) Int. Cl.
*G11C 11/03* (2006.01)
(52) U.S. Cl. ............... 365/185.29; 365/185.08; 365/185.21; 365/189.2; 365/218
(58) Field of Classification Search ............ 365/185.29, 365/185.08, 189.21, 189.2, 218
See application file for complete search history.

(56) References Cited

U.S. PATENT DOCUMENTS

| | | | | |
|---|---|---|---|---|
| 5,828,604 A | * | 10/1998 | Kawai et al. ........... | 365/185.22 |
| 6,377,502 B1 | | 4/2002 | Honda et al. ........... | 365/230.03 |
| 6,717,852 B2 | | 4/2004 | Honda et al. ........... | 365/185.11 |
| 7,046,559 B2 | | 5/2006 | Saito .................... | 365/185.33 |
| 7,120,050 B2 | * | 10/2006 | Kawabata et al. ...... | 365/185.01 |
| 7,130,240 B2 | | 10/2006 | Chae et al. ............. | 365/233 |

FOREIGN PATENT DOCUMENTS

| | | |
|---|---|---|
| JP | 52114226 | 9/1977 |
| JP | 08329689 | 12/1996 |
| JP | 11073784 | 3/1999 |
| JP | 2000348492 | 12/2000 |
| JP | 2001325795 | 11/2001 |
| JP | 2003036680 | 2/2003 |
| JP | 2005222202 | 8/2005 |
| JP | 2005243117 | 9/2005 |

* cited by examiner

*Primary Examiner*—Pho M. Luu

(57) ABSTRACT

A nonvolatile storage including a plurality of blocks each serving as one unit in erasing operation and performs a plurality of erasing operations successively, the nonvolatile storage comprising: a volatile memory cell array for storing erase setting information on each block, the information indicating whether or not its associated block is a target to be erased; a write amplifier for writing the erase setting information in the volatile memory cell array; a first readout amplifier for reading out the erase setting information on a target block from the volatile memory cell array upon start of the erasing operation; and a second readout amplifier for reading out the erase setting information on a target block from the volatile memory cell array upon start of readout operation.

24 Claims, 11 Drawing Sheets (x=0~m)
(y=0~n)

NONVOLATILE STORAGE AND ERASE CONTROL

CLAIM OF PRIORITY

This is a continuation-in-part of International Application No. PCT/JP2006/314151, filed Jul. 18, 2006 which was not published in English under PCT Article 21(2).

FIELD OF THE INVENTION

The present invention relates to a nonvolatile storage and an erase control method thereof. More particularly, the present invention relates to a nonvolatile storage having the function of successively erasing a plurality of sectors and an erase control method thereof.

BACKGROUND

In the flash memory and stored data erasing method thereof disclosed in Japanese Unexamined Patent Publication No. 2003-36680, when erasing a plurality of sectors, the addresses of the sectors to be erased are input so that their associated sector selection information TSAi goes to a high level and is input to a selector latch circuit 240 shown in FIG. 10. In the selector latch circuit 240, a selector latch pulse LACLK goes to a high level as one shot pulse, thereby latching the sector selection information TSAi in a latch circuit composed of inverter circuits 250, 260.

The latched sector selection information TSAi is input to an exclusive OR circuit 270 as erase sector information LASAi. Sector selection information ISAi generated in an internal address generation circuit is also input to the exclusive OR circuit 270. During erasing operation, a match comparison between the erase sector information LASAi and the sector selection information ISAi is performed in the exclusive OR circuit 270. Whenever the sector selection information ISAi sequentially generated by the internal address generation circuit coincides with the erase sector information LASAi latched as a sector to be erased, the erasing operation is performed.

According to Japanese Unexamined Patent Publication No. 2003-36680, each piece of erase sector information LASAi, which is 1 bit data used for identifying a sector to be selected, is latched by the latch circuit composed of the inverter circuits 250, 260. The inverter circuits 250, 260 that constitute the latch circuit are logic gates used for performing normal logic operation and are configured to have satisfactory load driving ability. Therefore, they disadvantageously occupy large area, compared to memory cells etc. capable of storing 1 bit data.

Under present circumstances, the number of sectors provided in a nonvolatile storage is increasing with the increasing capacity of nonvolatile storages and therefore, the number of bits of erase sector information LASAi that informs whether each sector is to be erased also increases. This brings about the problem that the latch circuit for storing the erase sector information LASAi unavoidably increases in circuit scale, occupying larger area.

SUMMARY

An embodiment of the invention can include a nonvolatile storage and an erase control method thereof, which nonvolatile storage utilizes a volatile memory cell array for storing erase setting information that informs whether or not each block serving as one unit in erasing operation is a target to be erased, and which nonvolatile storage has readout amplifiers that are used for reading out the erase setting information stored in the volatile memory cell array and are individually used in erasing operation and readout operation respectively, so that the erase setting information can be stored with high storage density and minimum storage capacity.

In order to achieve the above, in one embodiment, there is provided a nonvolatile storage which has a plurality of blocks each serving as one unit in an erasing operation, the nonvolatile storage comprising:

a volatile memory cell array for storing erase setting information on each block, the information indicating whether or not its associated block is a target to be erased;

a write amplifier for writing the erase setting information in the volatile memory cell array;

a first readout amplifier for reading out the erase setting information on a target block from the volatile memory cell array upon start of an erasing operation; and a second readout amplifier for reading out the erase setting information on a target block from the volatile memory cell array upon start of a readout operation.

The nonvolatile storage according to an embodiment of the invention has a plurality of blocks each serving as one unit in the erasing operation and successively performs a plurality of erasing operations. In this nonvolatile storage, the erase setting information on each block is stored in the volatile memory cell array with a write amplifier, the erase setting information being set information that indicates whether its associated block is a target to be erased. Among the stored erase setting information, the erase setting information on a block designated as a target to be erased is read out by the first readout amplifier upon start of the erasing operation, and the erase setting information on a block designated as a target to be read out is read out by the second readout amplifier upon start of the readout operation.

Furthermore, there is provided an erase control method for a nonvolatile storage which has a plurality of blocks each serving as one unit in erasing operation and performs a plurality of erasing operations successively, the method comprising:

storing erase setting information on each block in a volatile memory cell array, the erase setting information indicating whether or not its associated block is a target to be erased;

reading out the erase setting information on a target block among the stored erase setting information through a first path upon start of the erasing operation; and reading out the erase setting information on a target block among the stored erase setting information through a second path upon start of the readout operation.

In the erase control method of an embodiment of the invention applied to a nonvolatile storage that has a plurality of blocks each serving as one unit in the erasing operation and performs a plurality of erasing operations successively, after the erase setting information on each block, which information is set information that indicates whether its associated block is a target to be erased, is stored in the volatile memory cell array, the stored erase setting information on a block designated as a target to be erased is read out through the first path upon start of the erasing operation, and the stored erase setting information on a block designated as a target to be read out is read out through the second path upon start of the readout operation.

In an embodiment with the arrangement described above, while storing, in the volatile memory cell array, the erase setting operation on each block that serves as one erasing unit, the information indicating whether its associated block is a target to be erased, the readout of the erase setting information from the volatile memory cell array can be independently carried out with the first readout amplifier in the erasing operation and with the second readout amplifier in the readout operation. In each of the erasing operation and the readout operation, the information can be read out by a dedicated readout amplifier. Therefore, even if the period of the erasing operation and the period of the readout operation overlap each other, the erase setting information indicative of whether a target block of the erasing operation is to be erased and the erase setting information indicative of whether a target block of the readout operation is to be erased can be simultaneously read out from the volatile memory cell array.

In an embodiment, the volatile memory cell array capable of storing the erase setting information at high density can be shared between the erasing operation and the readout operation. In addition, even if the erasing operation and the readout operation are respectively independently performed with an asynchronous timing, the erase setting information on target blocks of these operations can be read out from the common volatile memory cell array. Further, the erase setting information indicative of whether each block is a target to be erased can be stored, occupying small area.

The nonvolatile storage of an embodiment of the invention utilizes a volatile memory cell array for storing erase setting information indicative of whether or not each block that serves as one unit in the erasing operation is a target to be erased. In addition, the nonvolatile storage can employ readout amplifiers individually used for the erasing operation and the readout operation respectively when reading out the erase setting information stored in the volatile memory cell array, so that the erase setting information can be stored with high storage density and minimum storage capacity.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
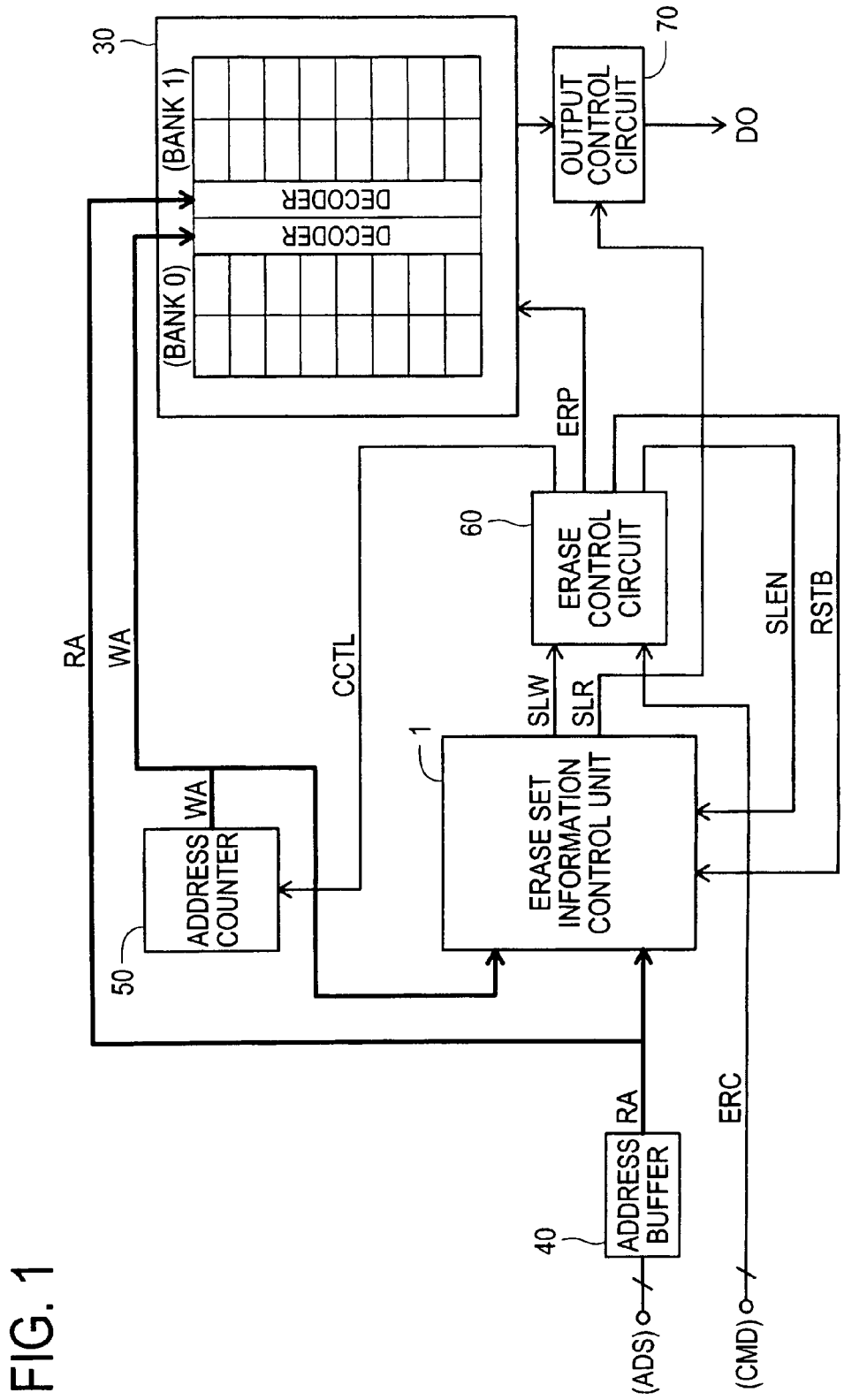
FIG. 1 is a circuit block diagram of a nonvolatile storage according to an embodiment of the invention.

FIG. 1 is a circuit block diagram of a nonvolatile storage according to an embodiment of the invention. In some cases, a nonvolatile memory cell array 30 provided for the nonvolatile storage is composed of a plurality of banks that are controlled nonexclusively to each other. FIG. 1 shows a case where the nonvolatile memory cell array 30 has two banks (bank 0, bank 1). Each bank is divided into sectors each of which serves as a unit when performing erasing operation on the nonvolatile memory cell array 30.

An erase setting information control unit 1 stores erase setting information indicative of whether or not each sector arranged in the nonvolatile memory cell array 30 is a target to be erased and performs control for reading out the erase setting information corresponding to a sector being accessed for erasing or readout. Sector addresses WA, RA, an initialization signal RSTB, and a set signal SLEN are input. According to the sector addresses WA, RA, an erase setting signal SLW for a sector designated as a target to be erased, and an erase setting signal SLR for a sector designated as a target to be read out are output. The initialization signal RSTB and the set signal SLEN are an initialization signal RSTB and set signal SLEN, respectively, for an SRAM array 11 (see FIG. 2) that is provided in the erase setting information control unit 1 and exemplifies the volatile memory cell array.

For each sector within the nonvolatile memory cell array 30, the sector address RA for the readout operation output from an address buffer 40 and the sector address WA for the erasing operation output from an address counter 50 are decoded by decoders (described later) and selected. The sector addresses WA, RA are for identifying the sectors.

The address buffer 40 is an input buffer configured to receive an address signal that is input from the outside of the nonvolatile storage through an address terminal (ADS). When reading out data from the nonvolatile memory cell array 30 in the readout operation and when designating a sector as a target to be erased in the erasing operation, the address of the target sector is input.

An address counter 50 is an internal address generation circuit and generates the sector address WA when the erasing operation is performed on the nonvolatile memory cell array 30. In the erasing operation, the address counter 50 sequentially counts up to output the sector address WA.

An erase control circuit 60 controls the erasing operation performed on the nonvolatile memory cell array 30. Upon input of an erase command ERC through a command terminal (CMD), the set signal SLEN is output to the erase setting information control unit 1. In the erase setting information control unit 1, erase setting information is stored in the SRAM array 11 (see FIG. 2) according to the sector address RA input from the address terminal (ADS) input together with the erase command ERC. Upon completion of the input of the erase command ERC, the erase control circuit 60 outputs a counter control signal CCTL to the address counter 50. Thereby, the address counter 50 starts counting operation to output the sector address WA. The erase control circuit 60 receives the erase setting signal SLW for each sector address WA from the erase setting information control unit 1, which signal SLW is indicative of whether or not the sector address WA designates a sector to be erased. If it is determined that the erase setting signal SLW indicates a sector to be erased, an erasing pulse signal ERP is output to the nonvolatile memory cell array 30.

The SRAM array 11, that is provided in the erase setting information control unit 1, stores the erase setting information on the sectors designated by the sector addresses WA, RA that are for identifying the sectors arranged in the nonvolatile memory cell array 30. In the SRAM array 11, the sector addresses WA, RA are used as the storage address of a memory cell. Thereby, the sector addresses WA, RA used when accessing a sector in the nonvolatile memory cell array 30 are used without change for reading out erase setting information from the SRAM array 11 (see FIG. 2).

An output control circuit 70 outputs data read out from the nonvolatile memory cell array 30 in normal readout operation. In addition, the output control circuit 70 performs control for outputting specified status information, in response to a readout command input during the erasing operation. The status information is output in response to the erase setting signal SLR that indicates whether the sector designated as a target to be read out is a sector to be erased. The status information for a sector set as a target to be erased differs from that for a sector that is not set as a target to be erased.

The erase setting information control unit 1 provided in the nonvolatile storage shown in FIG. 1 is effective when the erasing operation performed per sector is performed on a plurality of sectors successively. Where the erasing operation is successively performed on a plurality of sectors, the erase commands ERC are sequentially input together with the sector addresses RA of sectors to be erased. According to the sector address RA input whenever the erase command ERC is input, the erase setting information indicative of whether or not the input sector address RA designates a sector to be erased is stored in the erase setting information control unit 1, whereby it can be confirmed whether the sector designated as a target to be erased or read out in the erasing operation performed upon completion of input of the erase command ERC or in response to a readout command input during the erasing operation is a sector set as a target to be erased.

Figure 2:
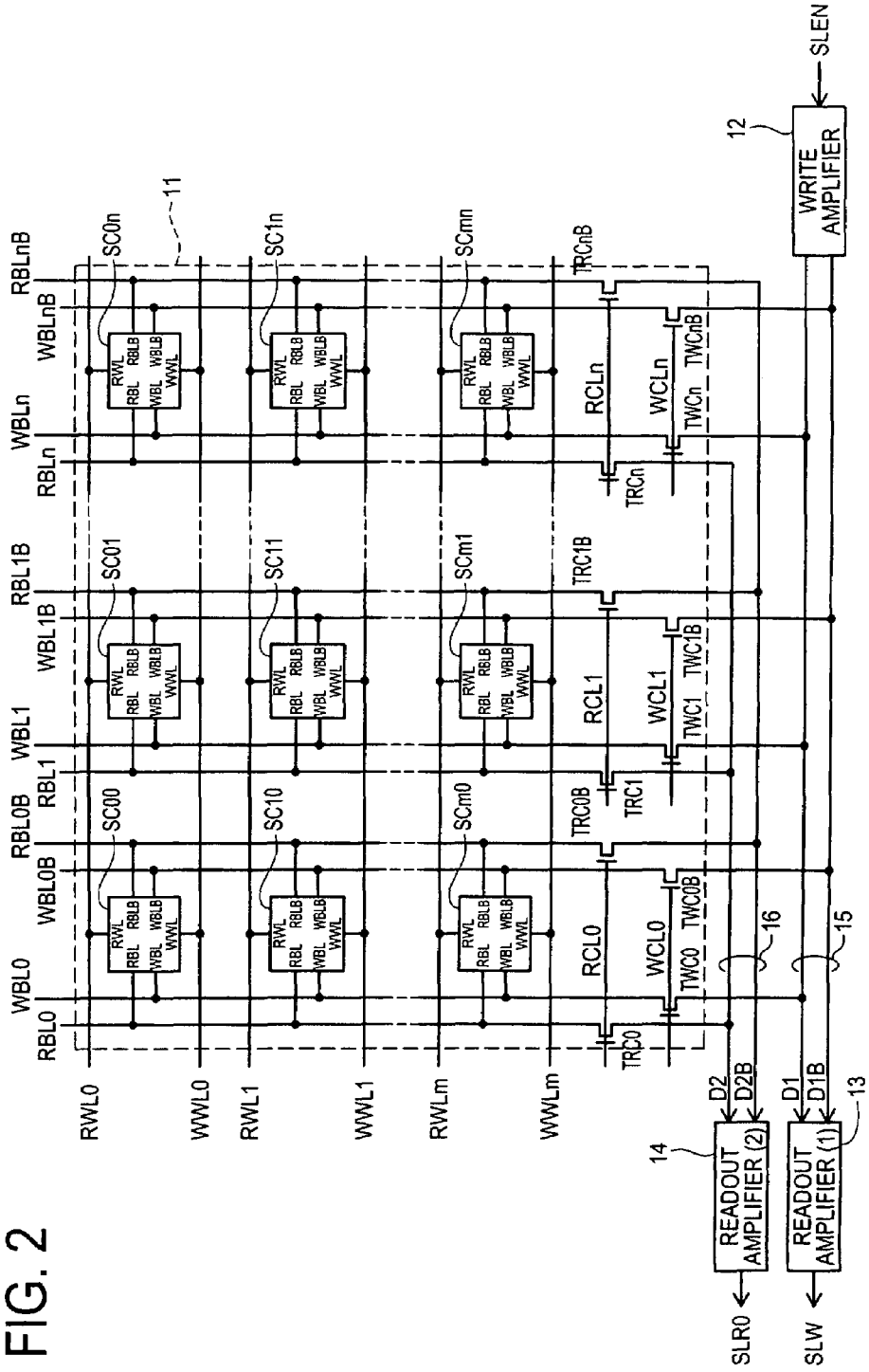
FIG. 2 is a circuit block diagram showing a portion of an erase setting information control unit in accordance with an embodiment of the invention.

FIG. 2 is a circuit block diagram of an embodiment of the invention showing the erase setting information control unit 1 and, more particularly, the configuration of the SRAM array 11 for storing the erase setting information and the circuit part for inputting and outputting the erase setting information to and from the SRAM array 11.

The erase setting information control unit 1 of this embodiment has the SRAM array 11 as the volatile memory cell array for storing the erase setting information. Memory cells SC00 to SCmn which constitute the SRAM array 11 are respectively coupled to two pairs of bit lines through cell section gates. More specifically, the memory cells SC00 to SCm0 are coupled to a pair of bit lines WBL0/WBL0B and to a pair of bit lines RBL0/RBL0B by cell select lines WWL0 to WWLm and cell select lines RWL0 to RWLm. The memory cells SC01 to SCm1 are coupled to a pair of bit lines WBL1/WBL1B and to a pair of bit lines RBL1/RBL1B by cell select lines WWL0 to WWLm and cell select lines RWL0 to RWLm. Similarly, the memory cells SC0n to SCmn are coupled to a pair of bit lines WBLn/WBLnB and to a pair of bit lines RBLn/RBLnB by the cell select lines WWL0 to WWLm and cell select lines RWL0 to RWLm.

Figure 3:
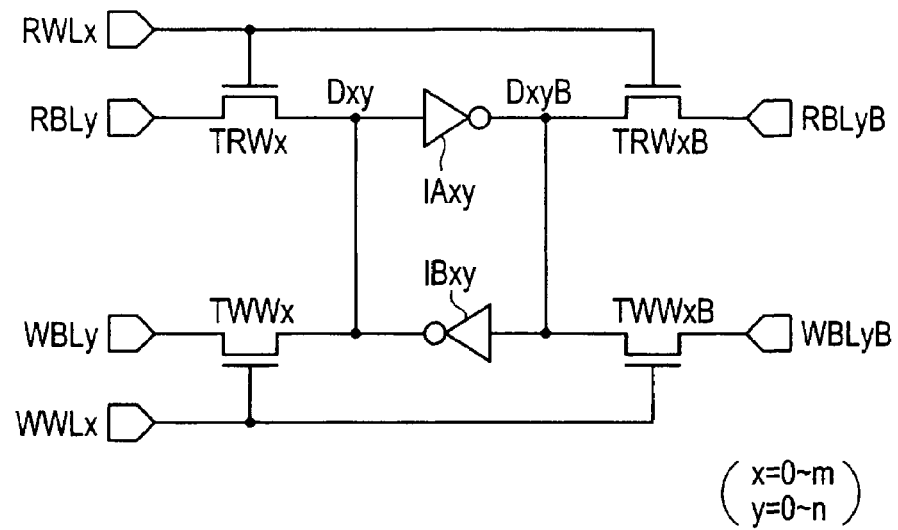
FIG. 3 is a circuit diagram of volatile memory cells in accordance with an embodiment of the invention.

FIG. 3 shows a circuit diagram of the memory cells SC00 to SCmn, in accordance with an embodiment of the invention. In FIG. 3, x=0 to m and y=0 to n. A memory core for storing 1 bit data is shown, in which inverter gates IAxy, IBxy have a latch configuration and their input and output terminals are coupled to each other. The nodes Dxy, DxyB of the memory core are coupled to bit lines WBLy, RBLy and bit lines WBLyB, RBLyB, respectively, thorough cell select gates TWWx, TRWx and cell select gates TWWxB, TRWxB, respectively. For example, the cell select line WWLx is coupled to the gate terminals of the cell select gates TWWx, TWWxB, whereas the cell select line RWLx is coupled to the gate terminals of the cell select gates TRWx, TRWxB.

If any one of the cell select lines WWLx is selected and goes to a high level, the memory cell (SCx0 to SCxn) coupled to the selected cell select line WWLx is coupled to its associated bit line pair (WBL0, WBL0B to WBLn, WBLnB). Similarly, if any one of the cell select lines RWLx is selected and goes to a high level, the memory cell (SCx0 to SCxn) coupled to the selected cell select line RWLx is coupled to its associated bit line pair (RBL0, RBL0B to RBLn, RBLnB).

The bit line pairs WBL0, WBL0B to WBLn, WBLnB and the bit line pairs RBL0, RBL0B to RBLn, RBLnB are coupled to column select gates TWC0, TWC0B to TWCn, TWCnB and column select gates TRC0, TRC0B to TRCn, TRCnB. Column select lines WCL0 to WCLn and column select lines RCL0 to RCLn are coupled to the gate terminals of the column select gates TWC0, TWC0B to TWCn, TWCnB and the gate terminals of the column select gates TRC0, TRC0B to TRCn, TRCnB, respectively.

If any one of the column select lines WCLy is selected and goes to a high level, any one of the column select gate pairs TWC0, TWC0B to TWCn, TWCnB (which are controlled by the selected column select line WCLy) is selected and any one of the corresponding bit line pairs WBL0, WBL0B to WBLn, WBLnB is coupled to the data line pair 15. The data line pair 15 is constituted by data lines D1, D1B and any one of the bit lines WBL0 to WBLn is coupled to the data line D1 whereas any one of the bit lines WBL0B to WBLnB is coupled to the data line D1B.

Similarly, if any one of the column select lines RCLy is selected and goes to a high level, any one of the column select gate pairs TRC0, TRC0B to TRCn, TRCnB (which are controlled by the selected column select line RCLy) is selected and any one of the corresponding bit line pairs RBL0, RBL0B to RBLn, RBLnB is coupled to the data line pair 16. The data line pair 16 is constituted by data lines D2, D2B and any one of the bit lines RBL0 to RBLn is coupled to the data line D2 whereas any one of the bit lines RBL0B to RBLnB is coupled to the data line D2B.

The data lines 15, 16 are coupled to the readout amplifier (1) 13 and the readout amplifier (2) 14, respectively, and the readout amplifiers 13, 14 output an erase setting signal SLW and an erase setting original signal SLR0, respectively.

Coupled to the data line 15 is a write amplifier 12. The write amplifier 12 is for storing, in the SRAM array 11, erase setting information on a sector to be erased that is designated by the sector address RA input through the address terminal (ADS) together with the erase command ERC. The sector address RA is decoded, the cell select line WWLx and the column select line WCLy are selected, and the erase setting information is stored in the corresponding memory cell (SC00 to SCmn).

Figure 4:
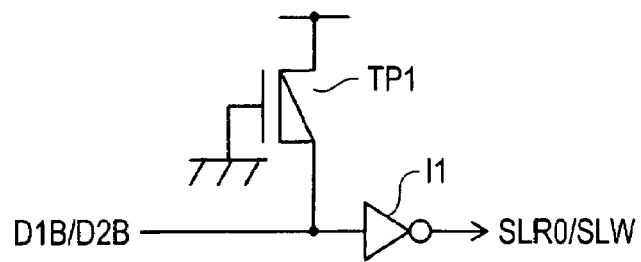
FIG. 4 is a circuit diagram of a readout amplifier in accordance with an embodiment of the invention.
Figure 5:
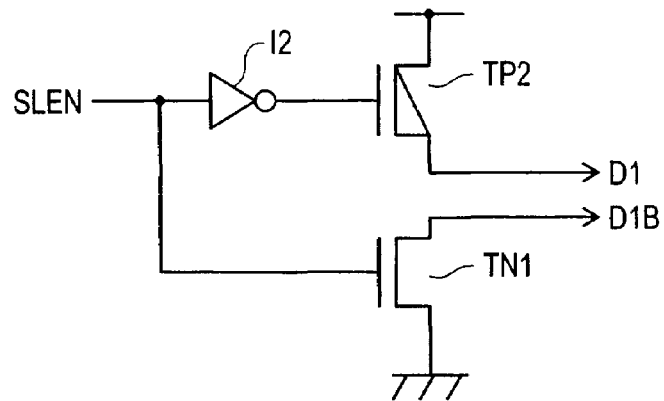
FIG. 5 is a circuit diagram of a write amplifier in accordance with an embodiment of the invention.

FIGS. 4, 5 are circuit diagrams that show examples of the readout amplifiers 13, 14 and the write amplifier 12, respectively, in accordance with various embodiments of the invention. The readout amplifier shown in FIG. 4 is configured such that either of the complementary data lines D1B and D2B serves as an input. The data line D1B or D2B is coupled to an inverter gate I1 and reversely amplified to output the erase setting signal SLW or the erase setting original signal SLR0. The source terminal and gate terminal of a PMOS transistor TP1 are coupled to a high-order voltage source and the ground potential, respectively. The drain of the PMOS transistor TP1 is coupled to the data line D1B or D2B. The PMOS transistor TP1 serves as a pull-up resistor for placing the data line D1B or D2B at a high level.

The write amplifier shown in FIG. 5 is configured to input the set signal SLEN that is output from the erase control circuit 60. The set signal SLEN is coupled to the gate terminal of an NMOS transistor TN1 and to an inverter gate I2. The output terminal of the inverter gate I2 is coupled to the gate terminal of a PMOS transistor TP2. The source terminals of the PMOS, NMOS transistors TP2, TN1 are coupled to the high-order voltage source and the ground potential, respectively. In response to the high-level set signal SLEN, the data line D1 is set at a high level and the data line D1B is set at a low level. Upon input of the erase command ERC, the set signal SLEN goes to a high level and the data lines D1/D1B are preset at high/low levels. Writing of the erase setting information in the memory cells SC00 to SCmn is performed with respect to a memory cell selected according to the sector address RA input together with the erase command ERC.

For example, the cell select lines WWL0 to WWLm and the column select lines WCL0 to WCLn are signal lines decoded by the sector address WA. Similarly, the cell select lines RWL0 to RWLm and the column select lines RCL0 to RCLn are signal lines decoded by the sector address RA.

According to the nonvolatile storage shown in FIGS. 1 to 5, the erase setting information, which is indicative of whether the sector designated by the sector address WA output from the address counter 50 when executing the erasing operation, is a target to be erased is read out from the readout amplifier (1) 13 through the data line 15 by the cell select lines WWL0 to WWLm and the column select lines WCL0 to WCLn. Similarly, the erase setting information, which is indicative of whether the sector designated by the sector address RA input from the outside when executing the readout operation during the erasing operation, is a target to be erased is read out from the readout amplifier (2) 14 through the data line 16 by the cell select lines RWL0 to RWLm and the column select lines RCL0 to RCLn. The erase setting information can be read out from the SRAM array 11 with independent timings for the erasing operation and for the readout operation.

Figure 6:
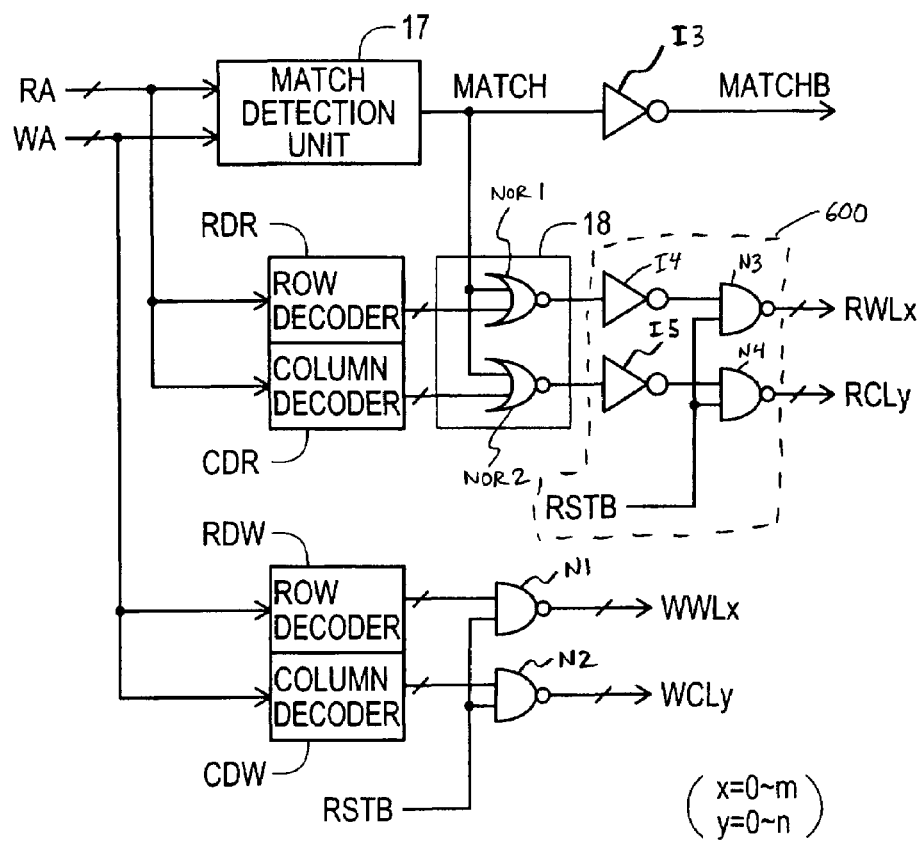
FIG. 6 is a circuit block diagram showing a portion of the erase setting information control unit in accordance with an embodiment of the invention.
Figure 7:
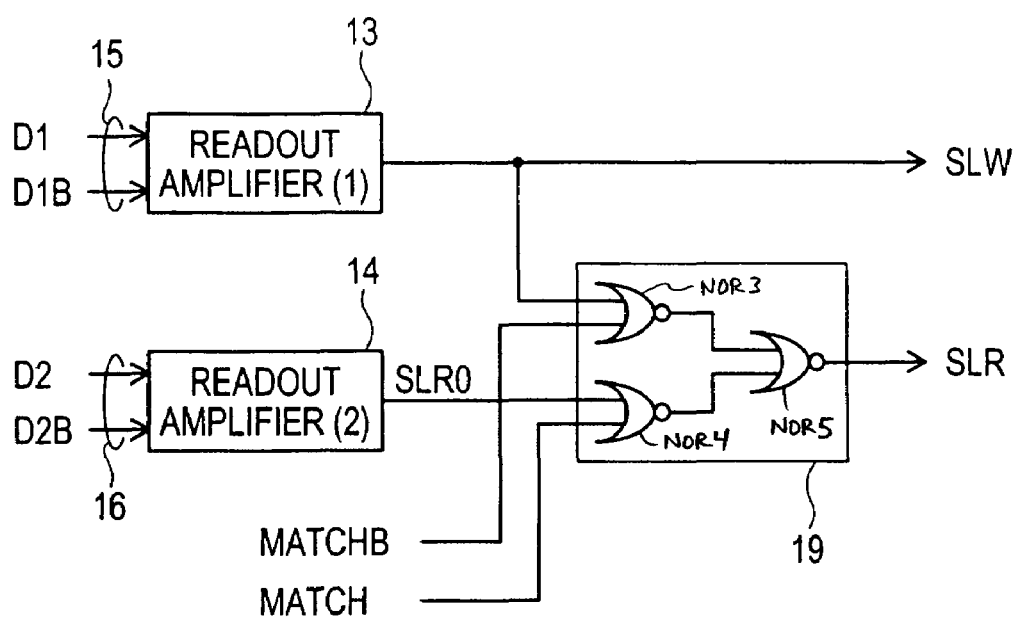
FIG. 7 is a circuit block diagram showing a portion of the erase setting information control unit in accordance with an embodiment of the invention.

FIG. 6 is a circuit block diagram of an embodiment of the invention showing a circuit part of the erase setting information control unit 1 where the memory cells SC00 to SCmn are selected in accordance with the sector addresses WA, RA. FIG. 7 is a circuit block diagram of an embodiment of the invention showing a circuit part of the erase setting information control unit 1 where the readout amplifiers 13, 14 output an erase setting signal.

In FIG. 6, the sector addresses WA, RA are input to row/column decoders RDW/CDW and RDR/CDR, respectively. The sector addresses WA, RA are input to a match detection unit 17. If the sector addresses WA, RA match, the match detection unit 17 outputs a match signal MATCH. The output of the match detection unit 17 can be coupled to an inverter gate I3. As such, the match signal MATCH can be received by the inverter gate I3, which can produce and output match signal MATCHB. The match detection unit 17 can easily perform match detection by using an exclusive circuit or the like for every bit that constitutes the sector addresses WA, RA.

The decode signals decoded by the row/column decoders RDW/CDW are input to NAND gates N1, N2 (respectively) together with a reset signal RSTB. The NAND gates N1, N2 output signals to the cell select line WWLx and column select line WCLy, respectively. The decode signals decoded by the row/column decoders RDR/CDR are input to a select gate control unit 18 together with the match signal MATCH. The select gate control unit 18 is constituted by NOR gates NOR1, NOR2 to perform NOR logic operation on the decode signal output from the row/column decoders RDR/CDR (respectively) and the match signal MATCH. The NOR gates NOR1, NOR2 can output signals to the cell select line RWLx and the column select line RCLy (respectively). It is noted that inverter gates I4, I5, NAND gates N3, N4, and reset signal RSTB shown within a dashed enclosure 600 are not implemented as part of the present embodiment of FIG. 6. However, it is pointed out that an embodiment that includes the inverters I4, I5, NAND gates N3, N4, and reset signal RSTB shown within the dashed enclosure 600 as part of FIG. 6 is described below.

FIG. 7 shows a circuit configuration including the readout amplifiers 13, 14 and an amplifier output control unit 19. The readout amplifier (1) 13 coupled to the data line pair 15 (D1, D1B) amplifies the erase setting information on the sector designated by the sector address WA. The output signal of the readout amplifier (1) 13 is the erase setting signal SLW. The erase setting signal SLW indicates whether or not the sector designated by the sector address WA is a target to be erased in the erasing operation. The readout amplifier (2) 14 coupled to the data line pair 16 (D2, D2B) amplifies the erase setting information on the sector designated by the sector address RA. The output signal of the readout amplifier (2) 14 is the erase setting original signal SLR0. The erase setting original signal SLR0 is input to the amplifier output control unit 19 together with the erase setting signal SLW. Further, the match signal MATCH and its complementary signal MATCHB are input to the amplifier output control unit 19.

In the amplifier output control unit 19, the erase setting original signal SLR0 and the match signal MATCH are input to a NOR gate NOR4 and the erase setting signal SLW and the match signal MATCHB are input to a NOR gate NOR3. The outputs of the output terminals of these NOR gates NOR3, NOR4 are input to a NOR gate NOR5 at the second stage. The NOR gate NOR5 at the second stage outputs the erase setting signal SLR.

In the nonvolatile storage shown in FIGS. 6, 7, if the reset signal RSTB is at a high level (not indicating a reset state) and the match signal MATCH is at a low level (indicating that the sector addresses WA, RA differ from each other), the erase setting signals SLW, SLR corresponding to the sector addresses WA, RA are read out according to the cell select line WWLx, the column select line WCLy; and the cell select line RWLx, the column select line RCLy that are output from the row/column decoders RDW/CDW; RDR/CDR, respectively.

In the nonvolatile storage shown in FIGS. 2, 6, the reset signal RSTB is input to the NAND gates N1, N2 together with the decode signal decoded by the row/column decoders RDW/CDW shown in FIG. 6. On the other hand, a reset circuit (not shown) controlled in response to the reset signal RSTB is coupled to the data line pair 15 (D1, D1B) shown in FIG. 2. When the reset signal RSTB goes to a low level, the cell select line WWLx and the column select line WCLy go to a high level, the data line D1 is allowed to go to a low level by the reset circuit (not shown), and the data line D1B goes to a high level. Thereby, the memory cells SC00 to SCmn of the SRAM array 11 store the erase setting information on their corresponding sectors of the nonvolatile memory which sectors are not a target to be erased.

If the sector addresses WA, RA match, the match signal MATCH goes to a high level (with the match signal MATCHB at a low level) and the cell select line RWLx and the column select line RCLy are brought into a un-selected state by the select gate control unit 18. Thereby, the memory cell is selected by the cell select line WWLx and the column select line WCLy corresponding to the sector address WA.

In this case, the data from the memory cell is not read out in the data line pair 16 (D2, D2B). By using the amplifier output control unit 19, the signal output from the readout amplifier (1) 13 can be shared between the erase setting signals SLW, SLR, while the signal output from the readout amplifier (2) 14 is being masked.

In cases where the select gate control unit 18 is not provided, the same memory cell is coupled to the two readout amplifiers 13, 14 not only by the cell select line WWLx and the column select line WCLy but also by the cell select line RWLx and the column select line RCLy corresponding to the sector address RA. If the bit data stored in the memory cell is at a high level, the data line D1B or D2B coupled to the readout amplifiers 13, 14 will be coupled to the node DxyB of the memory cell. For example, the node DxyB is at a low level. Since two pull-up resistors (PMOS transistors) are brought into the situation in which they are coupled to the node DxyB at a low level, there arises a possibility that the margin for the readout properties of data may be lessened and in the worst case, the value of stored data may invert. If the sector addresses WA, RA match in cases where the select gate control unit 18 is provided, a decrease in a readout margin and the erroneous inversion of data can be prevented by limiting the number of data readout paths to one.

Figure 8:
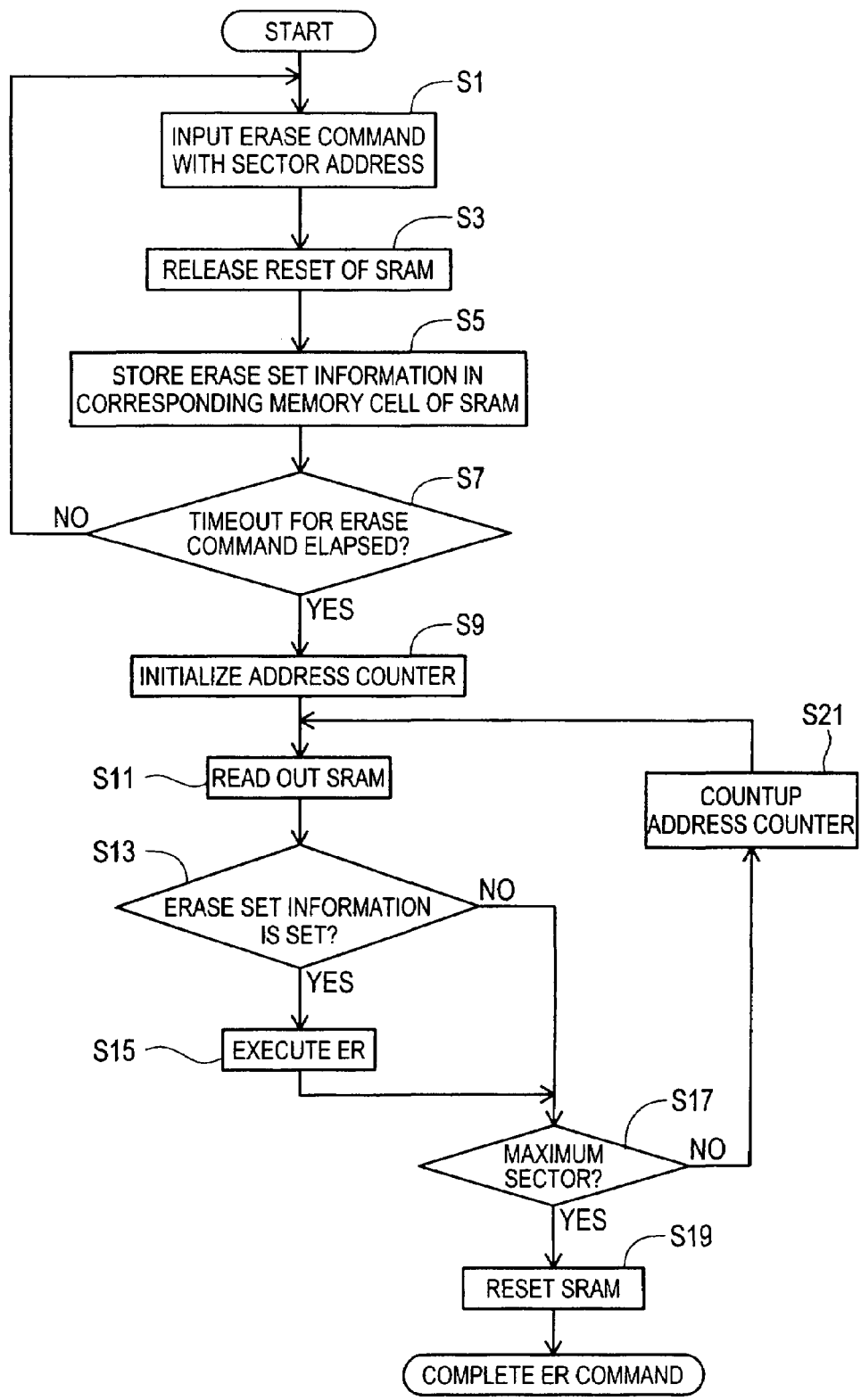
FIG. 8 is a flow chart of continuous erasing operation in accordance with an embodiment of the invention.

FIG. 8 shows a flow chart of the erasing operation in accordance with various embodiments of the invention. If the erase command ERC is input along with the sector address RA of a sector to be erased (Step S1), the erase command ERC is input to the erase control circuit 60 (see FIG. 1). The reset signal RSTB transitions to a high level and the SRAM array 11 provided in the erase setting information control unit 1 (see FIG. 1) is released from its reset condition (Step S3). Thereafter, the erase setting information is stored in the memory cell of the SRAM array 11 which memory cell corresponds to the sector address RA (Step S5).

If the erase command ERC and the sector address RA are further input before an elapse of an input timeout period for the erase command ERC (Step S7: N0), the program returns to Step S1 to perform the operation for storing the erase setting information in the memory cell of the SRAM array 11 which memory cell corresponds to the newly input sector address RA. If the input timeout period for the erase command ERC has elapsed (Step S7: YES), the actual erasing operation for applying an erasing bias is started by the erase control circuit 60.

After initialization of the address counter 50 (see FIG. 1) (Step S9), the erase setting information corresponding to the sector address WA output from the address counter 50 is read out from the SRAM array 11 (Step S11). If the readout erase setting information indicates a sector to be erased (Step S13: YES), the erase pulse signal ERP is output to the nonvolatile memory cell array 30 (see FIG. 1) to execute the erasing operation (Step S15). If the readout erase setting information does not indicate a sector to be erased (Step S13: N0) or the erasing operation has been already executed, it is then determined whether or not counting up to the maximum address in the counting operation by the address counter 50 has been completed (Step S17). If counting up to the maximum address has been completed (Step S17: YES), the contents of the SRAM array 11 are initialized to complete the erasing operation (Step S19). If counting up to the maximum address has not been completed (Step S17: N0), the address counter 50 is counted up (Step S21) and then, it returns to Step S11 again to repeat the same operation.

The address counter 50 continuously counts up and the erase setting information is read out from the SRAM array 11 each time when the sector address WA is output, so that it becomes possible to determine whether the sector address WA set within the address counter 50 is associated with a sector to be erased.

Figure 9:
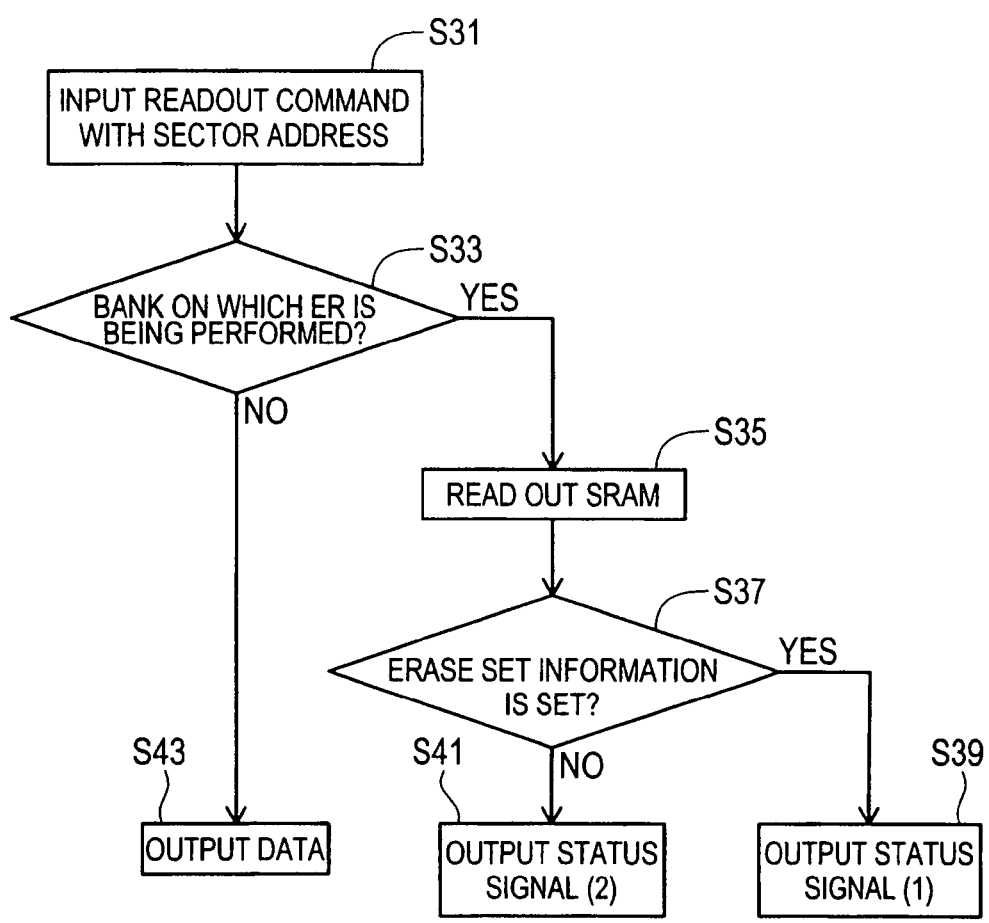
FIG. 9 is a flow chart of readout operation performed in the period of the continuous erasing operation in accordance with an embodiment of the invention.
Figure 10:
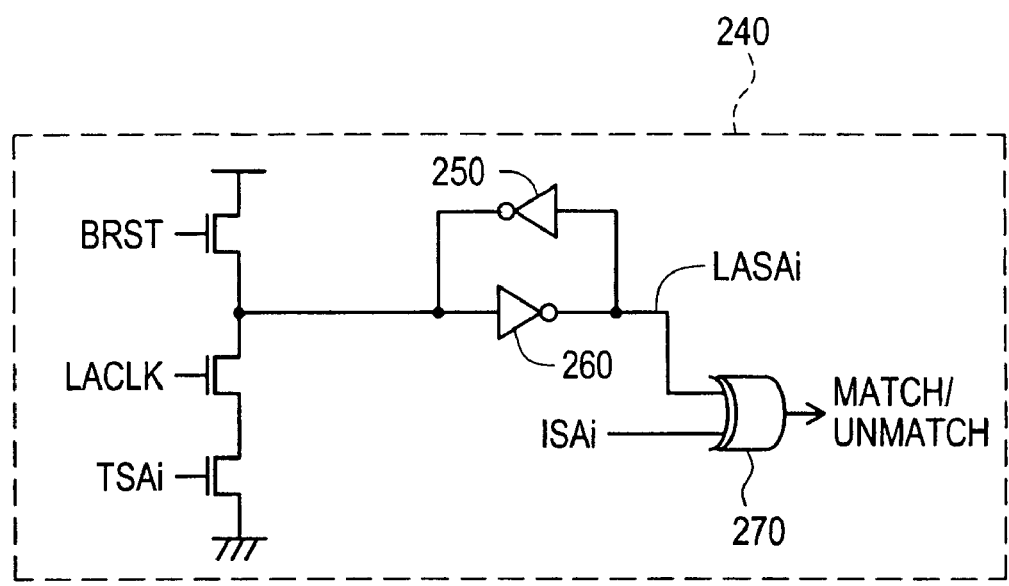
FIG. 10 shows a conventional selector latch circuit.

FIG. 9 shows a flow diagram of an operation performed in accordance with various embodiments of the invention when a readout command is input during the erasing operation shown in FIG. 8. If a readout command is input together with the address of a sector to be read out (Step S31), it is then determined according to the address indicative of a bank among the input addresses whether the bank for the sector to be read out is the bank on which the erasing operation is being performed (Step S33). If it is the same bank (Step S33: YES), the contents of the memory cell of the SRAM array 11 are read out, which memory cell corresponds to the sector address RA among the input addresses that is indicative of the sector (Step S35). If the erase setting signal SLR that has been read out indicates a sector to be erased (S37: YES), a status signal (1) is output which informs that a readout operation is being performed on a sector to be erased (Step S39). If the readout erase setting signal SLR does not indicate a sector to be erased (Step S37: N0), a status signal (2) is output which informs that a readout operation is being performed not on a sector to be erased but on a bank being erased (Step S41). For example, if the bank that is the target of the readout operation differs from the bank that is the target of the erasing operation (Step S33: N0), the data stored in the nonvolatile memory cell array 30 (see FIG. 1) is read out upon start of normal readout operation (Step S43).

According to the erase control method for the nonvolatile storage shown in FIGS. 8, 9, if a readout command is input while the erasing operation is performed, it is determined whether the bank that is the target of the erasing operation is the same as the bank that is the target of the readout operation. If the same bank is being accessed, it is then determined by checking the erase setting information stored in the SRAM array 11 whether or not the readout operation is being performed on a sector to be erased, and according to the result of the determination, the status signal (1) or (2) is output.

In this embodiment, the information on the sector to be erased and the information on the sector to be read out can be read out at the same time while sequentially storing the erase setting information on each (or every) sector in the SRAM array 11. Even when the erasing operation and the readout operation are performed with different independent timings, each sector may have only one piece of erase setting information, so that there is no need to provide each sector with information for the erasing operation and information for the readout operation. As a result, the storage area for the erase setting information can be reduced.

It is noted that the various embodiments of the invention described herein are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 µA).

Figure 11:
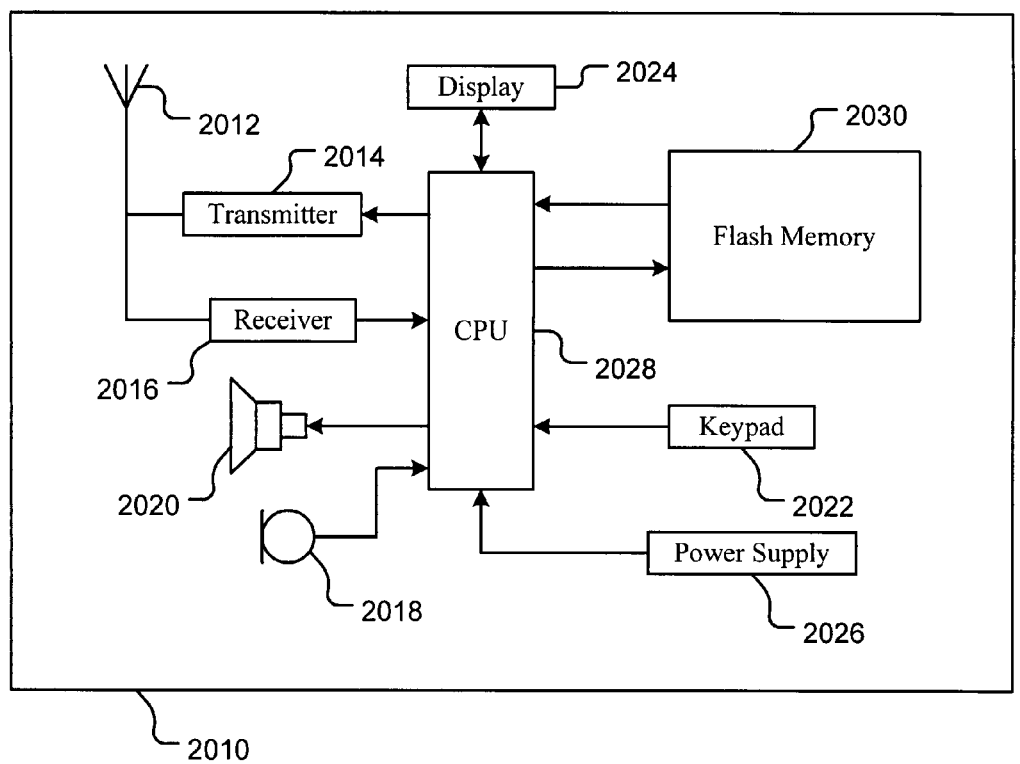
FIG. 11 illustrates a block diagram of an exemplary portable phone, upon which various embodiments of the invention may be implemented.

FIG. 11 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 can include a plurality of blocks each serving as one unit in an erasing operation, the flash memory 2030 can also include a volatile memory cell array for storing erase setting information on each block, the information indicating whether or not its associated block is a target to be erased, a write amplifier for writing the erase setting information in the volatile memory cell array, a first readout amplifier for reading out the erase setting information on a target block from the volatile memory cell array according to an erasing operation, and a second readout amplifier for reading out the erase setting information on a target block from the volatile memory cell array according to a readout operation. Note that these elements of the flash memory 2030 can be implemented in any manner similar to that described herein, but is not limited to such. An embodiment of the invention also provides a method of manufacturing flash memory 2030. In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 12:
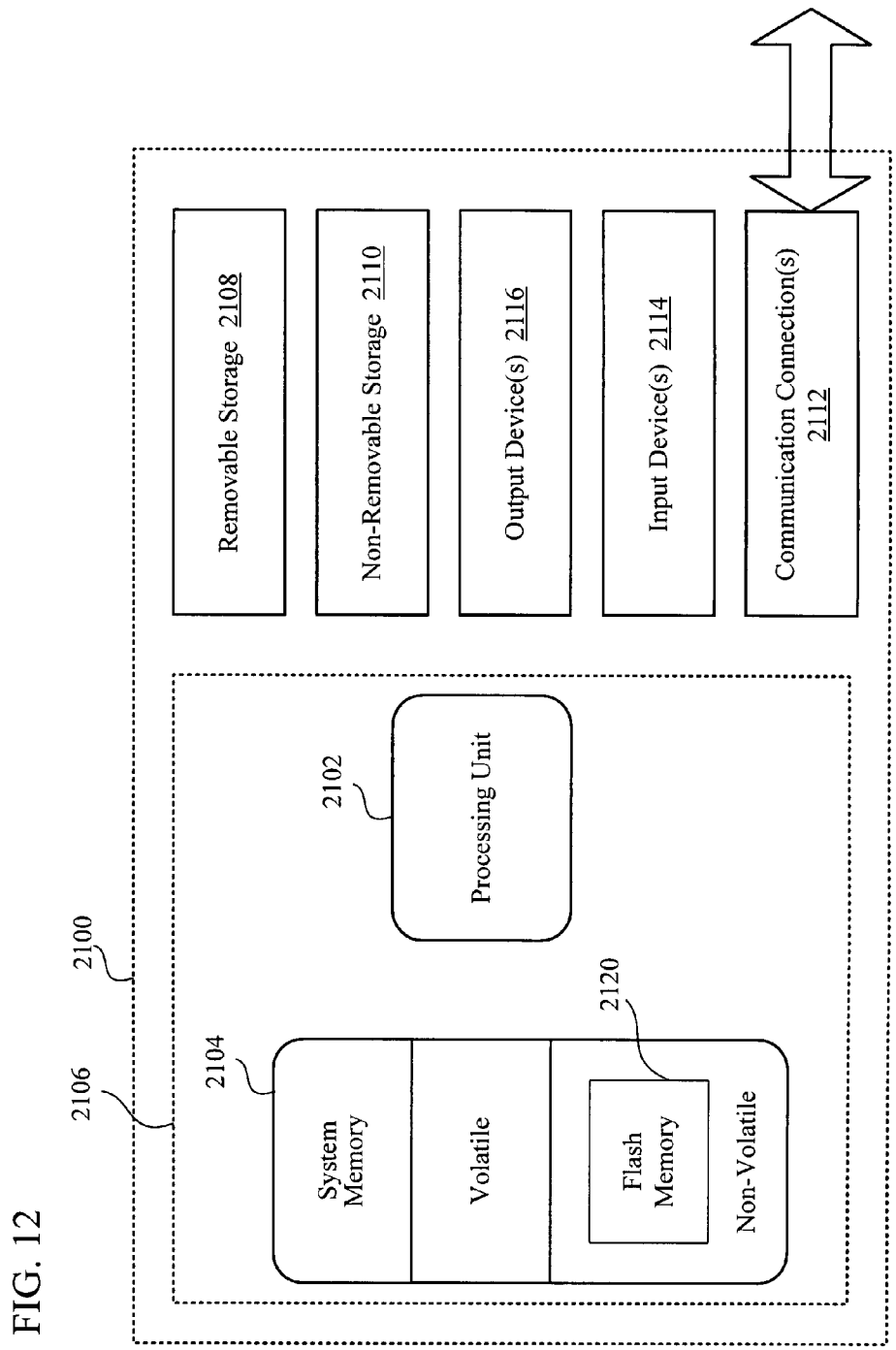
FIG. 12 illustrates a block diagram of an exemplary computing device, upon which various embodiments of the invention may be implemented.

FIG. 12 illustrates a block diagram of an exemplary computing device 2100, upon which various embodiments of the invention can be implemented. Although computing device 2100 is shown and described in FIG. 12 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 12.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 12 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 12 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 can include a plurality of blocks each serving as one unit in an erasing operation, the flash memory 2120 can also include a volatile memory cell array for storing erase setting information on each block, the information indicating whether or not its associated block is a target to be erased, a write amplifier for writing the erase setting information in the volatile memory cell array, a first readout amplifier for reading out the erase setting information on a target block from the volatile memory cell array according to an erasing operation, and a second readout amplifier for reading out the erase setting information on a target block from the volatile memory cell array according to a readout operation. Note that these elements of the flash memory 2120 can be implemented in any manner similar to that described herein, but is not limited to such. An embodiment of the invention also provides a method of manufacturing flash memory 2120. In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 13:
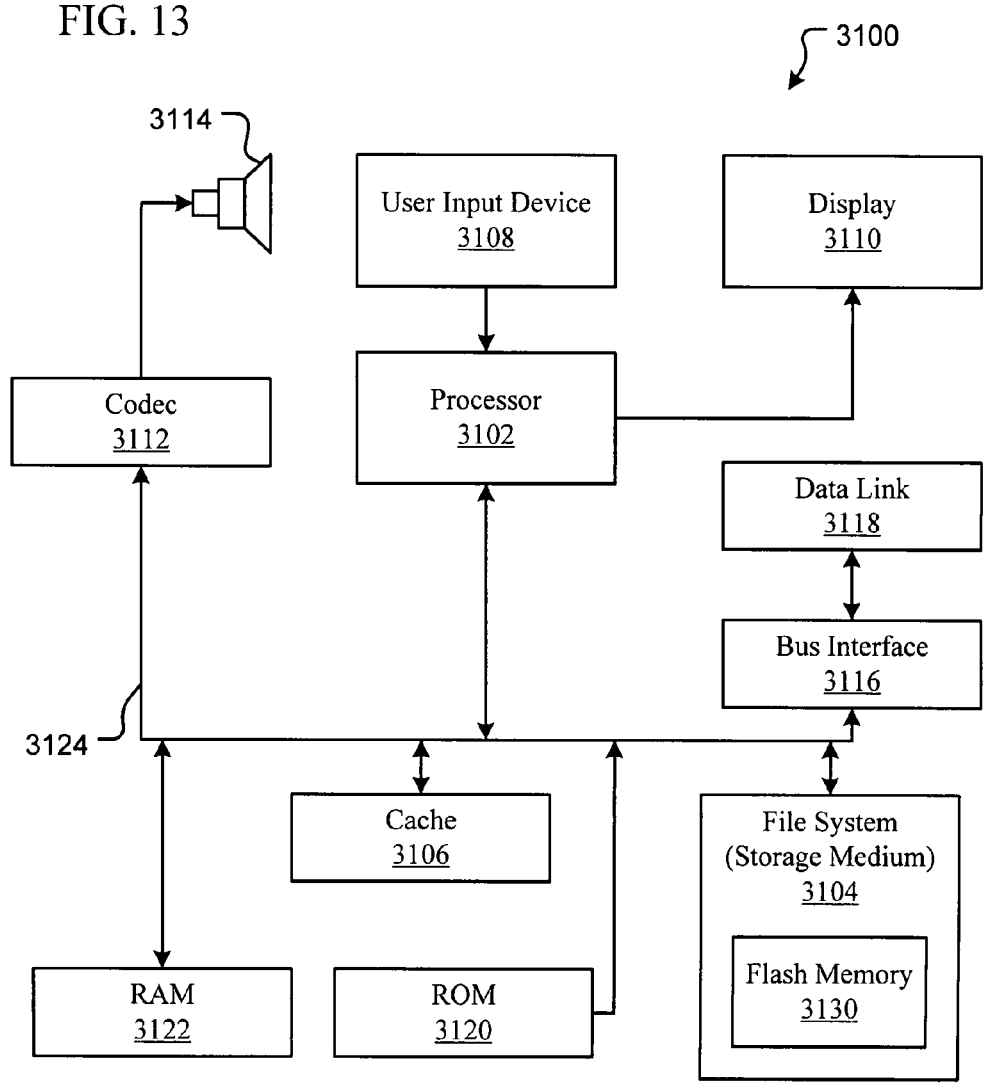
FIG. 13 illustrates an exemplary portable multimedia device, or media player, in accordance with various embodiments of the invention.

FIG. 13 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 can include a plurality of blocks each serving as one unit in an erasing operation, the flash memory 3130 can also comprise a volatile memory cell array for storing erase setting information on each block, the information indicating whether or not its associated block is a target to be erased, a write amplifier for writing the erase setting information in the volatile memory cell array, a first readout amplifier for reading out the erase setting information on a target block from the volatile memory cell array according to an erasing operation, and a second readout amplifier for reading out the erase setting information on a target block from the volatile memory cell array according to a readout operation. Note that these elements of the flash memory 2130 can be implemented in any manner similar to that described herein, but is not limited to such. An embodiment of the invention also provides a method of manufacturing flash memory 2130. In various embodiments, the flash memory 2130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

Various embodiments in accordance with the invention are summarized in the following.

The sectors arranged in the nonvolatile memory cell array 30 serve as an example of the blocks. The SRAM array 11 of the erase setting information control unit 1 serves as an example of the volatile memory cell array. The readout amplifier (1) 13 serves as an example of the first readout amplifier whereas the readout amplifier (2) 14 serves as an example of the second readout amplifier. The sector addresses WA, RA serve as an example of the block address and also as an example of the storage address of the erase setting information stored in the SRAM array 11. The data line pair 15 serves as an example of the first data line and the data line pair 16 as an example of the second data line. The cell select gates TWWx, TRWx (x=0 to m) and the column select gates TWC0, TWC0B to TWCn, TWCnB are examples of the first select gates. The cell select gates TWWxB, TRWxB (x=0 to m) and the column select gates TRC0, TRC0B to TRCn, TRCnB are examples of the second select gates.

Steps S1 to S7 serve as an example of storing the erase setting information on each block in the volatile memory cell array, the erase setting information being indicative of whether or not its associated block is a target to be erased. Steps S31 to S41 serve as an example of reading out the erase setting information associated with a target block among stored erase setting information through the first and second paths upon start of the erasing operation or readout operation. The path leading to the readout amplifier (1) 13 through the data line pair 15 exemplifies the first path, whereas the path leading to the readout amplifier (2) 14 through the data line pair 16 exemplifies the second path.

The step of making a comparison between the sector addresses WA, RA by the match detection unit 17 serves as an example of the step of detecting that a block address designating a target block of the erasing operation matches a block address designating a target block of the readout operation in cases where the erasing operation and the readout operation are respectively independently performed with an asynchronous timing. The step of masking the decode signal of the sector address RA by the select gate control unit 18 exemplifies the step of un-selecting, in accordance with the result of the match detection in the match detection step, either one of the first and second paths that have been selected according to a block address. The step of outputting the erase setting signal SLW as the erase setting signal SLR by the amplifier output control unit 19 if the match signal MATCH is output, exemplifies the step of setting the erase setting operation read out from either the first or second path maintained in a selected state according to the result of the match detection in the match detection step, as the erase setting information associated with the erasing operation and readout operation.

As understood from the above description, according to an embodiment, while the erase setting information indicative of whether each sector of the nonvolatile memory cell array 30 is a target to be erased is stored in the SRAM array 11, each sector serving as one unit in erasing operation, readout of the erase setting information from the SRAM array 11 is carried out with the readout amplifier (1) 13 in the erasing operation and with the readout amplifier (2) 14 in the readout operation. Therefore, readout in the erasing operation and readout in the readout operation can be performed independently from each other. Even if the period of the erasing operation and the period of the readout operation overlap each other, the erase setting information on a target sector associated with the erasing operation and the erase setting information on a target sector associated with the readout operation can be simultaneously read out from the SRAM array 11.

The SRAM array 11 capable of storing the erase setting information at high density can be shared between the erasing operation and the readout operation. Furthermore, even when the erasing operation and the readout operation are respectively independently executed with an asynchronous timing, the erase setting information on a target sector associated with the erasing operation and the erase setting information on a target sector associated with the readout operation can be read out from the common SRAM array 11. As a result, the erase setting information indicative of whether or not each sector is set as a target to be erased can be stored, occupying small area.

Although the invention has been described in various embodiments where a sector can serve as one unit in erasing, the invention is not limited to this but is equally applicable to cases where a plurality of sectors, banks or other memory regions can serve as one unit in erasing.

In the readout amplifier shown in FIG. 4, the data lines D1B, D2B on the negative logic side among the data line pairs D1/D1B and D2/D2B shown in FIG. 2 serve as input. However, a readout circuit in which the data lines D1, D2 on the positive logic side serve as input may be employed.

In FIG. 2, the write amplifier 12 may be coupled to the data line pair 16. In this case, if the reset signal RSTB shown in FIG. 6 is at a low level, the output signals from the select gate control unit 18 are received by inverters I4, I5 (shown in dashed enclosure 600 of FIG. 6), which invert the signals. The outputs of inverters I4, I5 are coupled to NAND gates N3, N4 (shown in dashed enclosure 600), respectively. As such, the inversion signals output by inverters I4, I5 are input to the NAND gates N3, N4 (respectively) along with the reset signal RSTB (shown in dashed enclosure 600). Therefore, the NAND gates N3, N4 are able to activate the cell select line RWLx and the column select line RCLy (respectively) at a high level, and the outputs of the NAND gate N3, N4 are the cell select line RWLx and the column select line RCLy (respectively). The reset circuit that is not shown in the drawings is coupled to the data line pair 16.

When a readout command is input during the erasing operation as shown in FIG. 9, there is a case where a readout command is input after a suspend command has been input for suspending the erasing operation. In such a case, if the readout erase setting signal SLR is not associated with a target to be erased (S37: NO), the data stored in the nonvolatile memory cell array 30 (see FIG. 1) is read out upon start of normal readout operation. The reason for this is that although the readout operation is performed on a bank being erased, the erasing operation is suspended and therefore another readout operation can be executed.

In various embodiments in accordance with the invention, it is noted that any mention of "couple", "coupled", and/or "coupling" may include both direct and/or indirect connection between elements.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A nonvolatile storage which has a plurality of blocks each serving as one unit in an erasing operation, the nonvolatile storage comprising:
   a volatile memory cell array for storing erase setting information on each block, the information indicating whether or not its associated block is a target to be erased;
   a write amplifier for writing the erase setting information in the volatile memory cell array;
   a first readout amplifier for reading out the erase setting information on a target block from the volatile memory cell array according to an erasing operation; and
   a second readout amplifier for reading out the erase setting information on a target block from the volatile memory cell array according to a readout operation.

2. The nonvolatile storage according to claim 1, wherein the erase setting information is stored in the volatile memory cell array prior to the erasing operation.

3. The nonvolatile storage according to claim 1, wherein the readout operation is performed in a period when the erasing operation is performed.

4. The nonvolatile storage according to claim 1, wherein the volatile memory cell array uses a block address for identifying each block as the storage address of the erase setting information associated with the block.

5. The nonvolatile storage according to claim 1, further comprising:
   a first data line for coupling the volatile memory cell array to the first readout amplifier; and
   a second data line for coupling the volatile memory cell array to the second readout amplifier.

6. The nonvolatile storage according to claim 5, wherein the write amplifier is coupled to the first or second data line.

7. The nonvolatile storage according to claim 5,
   wherein the volatile memory cell array comprises:
   first select gates each of which is selected according to a block address that designates a target block of the erasing operation and each of which is for coupling a memory cell to the first data line; and
   second select gates each of which is selected according to a block address that designates a target block of the readout operation and each of which is for coupling a memory cell to the second data line.

8. The nonvolatile storage according to claim 7, further comprising:
- a match detection unit for detecting a match between a block address that designates a target block of the erasing operation and a block address that designates a target block of the readout operation when the erasing operation and the readout operation are respectively performed with an independent timing;
- a select gate control unit for un-selecting either the first or second select gates selected according to a block address, according to the result of the match detection performed by the match detection unit; and
- an amplifier output control unit for outputting an output signal from either the first or second readout amplifier coupled to the first or second select gate maintained in a selected state according to the result of the match detection performed by the match detection unit.

9. An erase control method for a nonvolatile storage which has a plurality of blocks each serving as one unit in an erasing operation, the method comprising:
- storing erase setting information on each block in a volatile memory cell array, the erase setting information indicating whether or not its associated block is a target to be erased;
- reading out the erase setting information on a target block among the stored erase setting information through a first path upon start of an erasing operation; and
- reading out the erase setting information on a target block among the stored erase setting information through a second path upon start of a readout operation.

10. The erase control method for a nonvolatile storage according to claim 9, wherein the readout operation is performed in a period when the erasing operation is performed.

11. The erase control method for a nonvolatile storage according to claim 9, wherein the storing erase setting information comprises a block address for designating each block is used as the storage address of the erase setting information associated with the block.

12. The erase control method for a nonvolatile storage according to claim 9, wherein the storing erase setting information comprises the erase setting information is stored through either the first or second path.

13. The erase control method for a nonvolatile storage according to claim 9, the method further comprising:
- detecting a match between a block address that designates a target block of the erasing operation and a block address that designates a target block of the readout operation when the erasing operation and the readout operation are respectively performed with an independent timing;
- un-selecting either the first or second path selected according to the block address, according to the result of the match detection performed in the detecting the match; and
- determining the erase setting information read out from either the first or second path maintained in a selected state to be erase setting information for the erasing operation and the readout operation according to the result of the match detection performed in the detecting the match.

14. A wireless communications device, comprising:
a processor;
a communications component coupled to the processor;
a transmitter coupled to the processor;
a receiver;
an antenna coupled to the transmitter circuit and the receiver circuit; and
a memory coupled to the processor, the memory including a plurality of blocks each serving as one unit in an erasing operation, the memory comprising:
- a volatile memory cell array for storing erase setting information on each block, the information indicating whether or not its associated block is a target to be erased;
- a write amplifier for writing the erase setting information in the volatile memory cell array;
- a first readout amplifier for reading out the erase setting information on a target block from the volatile memory cell array according to an erasing operation; and
- a second readout amplifier for reading out the erase setting information on a target block from the volatile memory cell array according to a readout operation.

15. The wireless communications device of claim 14, wherein said flash memory is NAND flash memory.

16. The wireless communications device of claim 14, wherein said flash memory is NOR flash memory.

17. The wireless communications device of claim 14, wherein said flash memory comprises at least one memory cell operable to store more than one bit.

18. A computing device comprising:
a processor;
an input component coupled to the processor;
an output component coupled to the processor; and
a memory coupled to the processor, the memory including a plurality of blocks each serving as one unit in an erasing operation, the memory comprising:
- a volatile memory cell array for storing erase setting information on each block, the information indicating whether or not its associated block is a target to be erased;
- a write amplifier for writing the erase setting information in the volatile memory cell array;
- a first readout amplifier for reading out the erase setting information on a target block from the volatile memory cell array according to an erasing operation; and
- a second readout amplifier for reading out the erase setting information on a target block from the volatile memory cell array according to a readout operation.

19. The computing device of claim 18, wherein said computing device is a personal computer (PC).

20. The computing device of claim 18, wherein said computing device is a personal digital assistant (PDA).

21. The computing device of claim 18, wherein said computing device is a gaming system.

22. A portable media player comprising:
a processor;
a cache coupled to the processor;
a user input component coupled to the processor;
a coder-decoder component coupled to the processor; and
a memory coupled to the processor, the memory including a plurality of blocks each serving as one unit in an erasing operation, the memory comprising:
- a volatile memory cell array for storing erase setting information on each block, the information indicating whether or not its associated block is a target to be erased;
- a write amplifier for writing the erase setting information in the volatile memory cell array;

a first readout amplifier for reading out the erase setting information on a target block from the volatile memory cell array according to an erasing operation; and a second readout amplifier for reading out the erase setting information on a target block from the volatile memory cell array according to a readout operation.

23. The portable media player of claim 22, wherein said portable media player is a portable music player.

24. The portable media player of claim 22, wherein said portable media player is a portable video player.

* * * * *